United States Patent [19]

Watanabe et al.

[11] Patent Number: 4,963,973

[45] Date of Patent: Oct. 16, 1990

[54] SEMICONDUCTOR DEVICE

[75] Inventors: Atsuo Watanabe, Hitachiohta; Yoshiaki Yazawa, Hitachi; Atsushi Hiraishi, Hitachi; Masataka Minami, Hitachi; Takahiro Nagano, Hitachi; Takahide Ikeda, Tokorozawa; Naohiro Momma, Hitachi, all of Japan

[73] Assignee: Hitachi, Ltd., Tokyo, Japan

[21] Appl. No.: 323,212

[22] Filed: Mar. 13, 1989

Related U.S. Application Data

[63] Continuation of Ser. No. 936,610, Dec. 1, 1986, abandoned.

[30] Foreign Application Priority Data

Nov. 29, 1985 [JP]  Japan ................................. 60-267170

[51] Int. Cl.$^5$ ............................................. H01L 27/02
[52] U.S. Cl. .......................................... 357/42; 357/43; 357/38; 357/90
[58] Field of Search ..................... 357/42, 90, 43, 38

[56] References Cited

U.S. PATENT DOCUMENTS 4,032,372  6/1977  Vora ..................................... 357/42
4,247,862  1/1981  Klein .................................... 357/90
4,604,790  8/1986  Bonn .................................... 357/42

OTHER PUBLICATIONS

J. Borland et al., "Advanced CMOS Epitaxial Processing for Latch-Up Hardening and Improved Epilayer Quality", Solid-State Technology, Aug. 1984, pp. 123–131.

Primary Examiner—Joseph E. Clawson
Attorney, Agent, or Firm—Antonelli, Terry, Stout & Kraus

[57] ABSTRACT

A semiconductor device has a well region formed in the surface of a substrate, and has semiconductor elements such as MOSFETs and bipolar transistors formed in the well region. The carrier concentration profile of the well region assumes the shape of a valley in the direction of depth thereof, and a minimum point thereof has a concentration of smaller than $5 \times 10^{15}$ cm$^{-3}$ and is located at a position within 1.6 μm from the surface of the substrate. Preferably, the minimum point should have a concentration of greater than $5 \times 10^{14}$ cm$^{-3}$ but smaller than $5 \times 10^{15}$ cm$^{-3}$, and more preferably a concentration of greater than $1 \times 10^{15}$ cm$^{-3}$ but smaller than $5 \times 10^{15}$ cm$^{-3}$.

3 Claims, 8 Drawing Sheets

SEMICONDUCTOR DEVICE

This application is a continuation application of application Ser. No. 06/936,610, filed Dec. 1, 1986, now abandoned.

BACKGROUND OF THE INVENTION

The present invention relates to a semiconductor device and more specifically to a semiconductor device in which MOSFETs (metal oxide silicon field effect transistors) are formed in the well regions of a semiconductor substrate maintaining high reliability, high degree of integration and high-speed operation.

FIG. 1 shows carrier concentration profiles of the conventional well structures. These profiles have been taught in a literature "Solid State Technology, Aug. 1984, pp. 123-131". FIG. 1(a) shows a well structure that is nowadays put into practice most generally, and in which the concentration profile is nearly uniform from the surface toward the direction of depth. In FIGS. 1(b) and 1(c), a high-concentration layer exists deep under the surface. This is called a retrograde well. Namely, a high-concentration layer is added to decrease the resistance of the well, in order to avoid a problem specific to the CMOS structure which contains both an n-channel MOSFET and a p-channel MOSFET, i.e., to avoid the parasitic thyristor effect. What makes a difference between FIG. 1(b) and FIG. 1(c) is that the high-concentration layer exists near the surface in FIG. 1(b) and exists deep under the surface in FIG. 1(c).

Generally, the concentration of well region of the MOS is intimately related to an initiation voltage that forms the channel when a voltage is applied to the gate electrode, i.e., intimately related to a threshold voltage $V_{TH}$. The threshold voltage $V_{TH}$ increases with the increase in the concentration. The threshold voltage $V_{TH}$ also increases when a voltage (substrate bias) of a direction opposite to the source is applied to the well, since the depletion layer just under the gate extends in the direction of depth and the amount of fixed charge increases in the depletion layer. The rate of $V_{TH}$ increment when the substrate bias is applied is called substrate effect constant K. The substrate effect constant K increases with the increase of the concentration and deteriorates the circuit performance in an integrated circuit in which the potential of the well region cannot be fixed. In the retrograde well structure which contains a high-concentration layer, effects such as $V_{TH}$ and K that affects the MOS characteristics must be avoided.

In the example of FIG. 1(b) which contains the high-concentration layer near the surface, the threshold voltage $V_{TH}$ and the substrate effect constant K may increase greatly.

Another important technical assignment for fine MOSFETs includes a problem of soft error caused by a-particles. This becomes conspicuous particularly in the memories. That is, alpha particles emitted from radioactive elements, such as uranium or thorium contained in trace amounts in the package material, fall on the MOSFET to generate about $10^6$ electron-hole pairs in the semiconductor substrate to form noise charge which causes the memory to erroneously operate. This is called alpha-ray soft error. The high-concentration layer in the retrograde structure works as a potential barrier wall against the noise charge generated in a portion under the high-concentration layer, and prevents the noise charge from flowing into the drain of the MOSFET. However, the high-concentration layer does not exhibit the barrier wall effect for the noise charge generated over the high-concentration layer. To cope with this problem, therefore, the high-concentration layer should be formed as close to the surface as possible, so that the noise charge is generated in small amounts.

In the example of FIG. 1(c) in which the high-concentration layer is formed deep under the surface, generation of noise charge is not reduced in the above-mentioned sense, and the problem of alpha-ray soft error is not solved.

SUMMARY OF THE INVENTION

The object of the present invention is to provide a semiconductor device having a retrograde well structure with a high-concentration layer, in which the high-concentration layer does not adversely affect MOS characteristics, and which features a decreased alpha-ray soft error rate and increased reliability.

According to the semiconductor device having a retrograde well structure of the present invention, the impurity concentration profile in the direction of depth has the shape of a valley, the concentration at a minimum concentration point is smaller than $5 \times 10^{15}$ cm$^{-3}$, and the position of the minimum concentration point is within 1.6 μm from the surface of the substrate.

The concentration at the minimum concentration point should be greater than $5 \times 10^{14}$ cm$^{-3}$ but smaller than $5 \times 10^{15}$ cm$^{-3}$, and more preferably greater than $1 \times 10^{15}$ cm$^{-3}$ but smaller than $5 \times 10^{15}$ cm$^{-3}$.

The principle of the present invention will now be explained.

FIG. 2 concretely illustrates a representative example of the well structure of the present invention. The well region has a p-type of conductivity. According to the present invention, a minimum point of concentration profile must exist in a hatched region of FIG. 2. In this example, the minimum point exists at a position about 0.5 μm away from the surface.

First, considered below is a problem of soft error caused by alpha particles. In the well structure having a concentration profile shown in FIG. 2, the problem stems particularly from the noise charge generated on the side of the surface with respect to a maximum concentration point in the high-concentration layer. FIG. 3 shows a relationship between the position of the maximum concentration point from the surface and the amount of the noise charge captured. Generally, the allowable limit of the captured electric charge is 20 fc. From FIG. 3, therefore, the maximum concentration point is located at a position 1.6 μm or more away under the surface. The minimum point should be located at a position closer to the surface than the maximum concentration point. From the above results of analysis, the minimum point should be located at a position of at least within 1.6 μm from the surface.

Effects of the high-concentration layer were studied in terms of $V_{TH}$ and K, and novel results were discovered as described below.

FIG. 4 illustrates relationships among the impurity concentration of the minimum point, threshold voltage $V_{TH}$ and substrate effect constant K in the concentration profile of the well shown in FIG. 2. The threshold voltage $V_{TH}$ is maintained nearly constant up to $10^{16}$ cm$^{-3}$ but increases as the concentration further increases. On the other hand, the substrate effect constant K monotonously increases with the increase in the concentration, which is different from the change of $V_{TH}$. This is due to the fact that the substrate effect constant K represents the concentration of a portion deeper under the surface than the portion which affects $V_{TH}$. From the above result, it is recognized that the concentration at the minimum point must be determined by taking the constant K into consideration rather than the threshold voltage $V_{TH}$. The allowable value of K is determined as described below. The power source voltage of 5 volts is used for general LSI's. It is therefore considered that the substrate bias of a maximum of 5 volts makes the situation worse. Therefore, the threshold voltage $V_{TH}$ should not increase even under the above condition. For this purpose, the substrate effect constant K should be smaller than $0.5\sqrt{}$. The results of FIG. 4 teach that the concentration should be smaller than $5 \times 10^{15}$ cm$^{-3}$.

The concentration of the minimum point should be greater than $5 \times 10^{14}$ cm$^{-3}$ from the standpoint of controllability during the production. More preferably, the concentration of the minimum point should be greater than $1 \times 10^{15}$ cm$^{-3}$, so that both the p-well and the n-well can be fabricated in an on-chip structure.

DETAILED DESCRIPTION OF THE PREFERRED EMBODIMENTS

Embodiment 1

Figure 5:
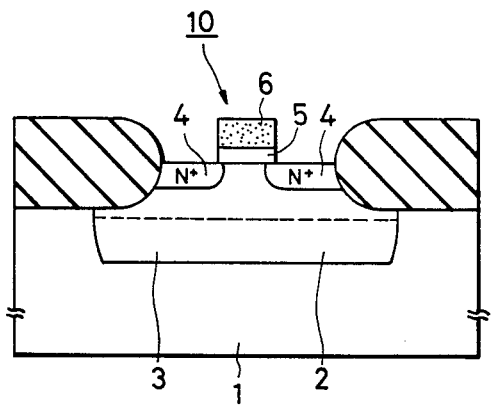
FIG. 5 is a section view of an n-channel MOSFET to which the present invention is adapted.

FIG. 5 is a section view of an n-channel MOSFET to which the present invention is adapted. A semiconductor substrate 1 is composed of p$^-$-type silicon and has a p-type well region 2 which contains a high-concentration layer 3. In the well region 2 is formed an n-channel MOSFET 10 which consist of n$^+$-type source and drain 4, a gate oxide film 5 and a gate electrode 6. A dotted line in the well region 2 indicates a position of a minimum point.

In this embodiment, the minimum point is formed at a position 0.7 $\mu$m deep from the surface, and has a concentration of $2 \times 10^{15}$ cm$^{-3}$.

The manufacturing process will now be described with reference to FIG. 6.

Figure 6:
FIGS. 6(1)–6(7) are diagrams explaining a process for producing a MOSFET according to an embodiment of the present invention.
Figure 6:
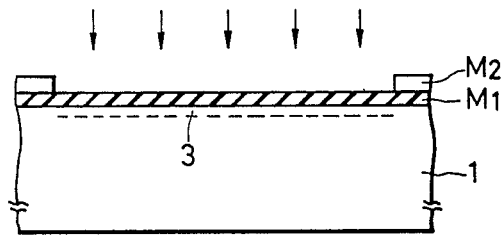
Figure 6:
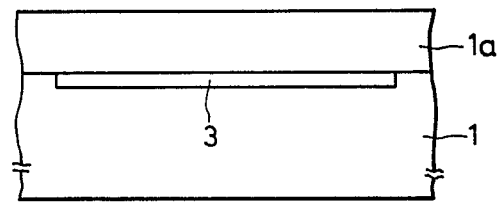
Figure 6:
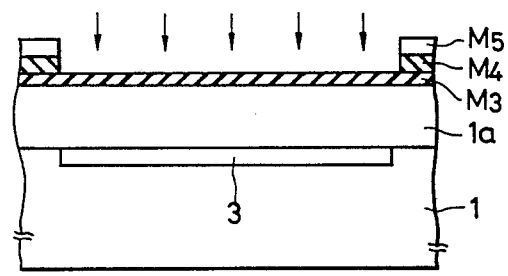
Figure 6:
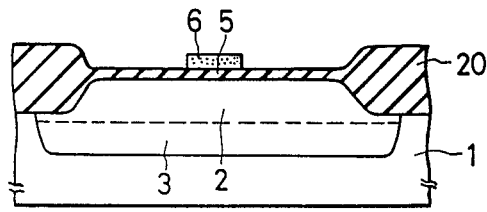
Figure 6:
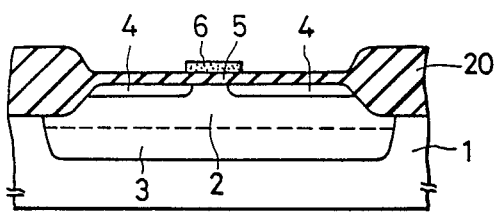
Figure 6:
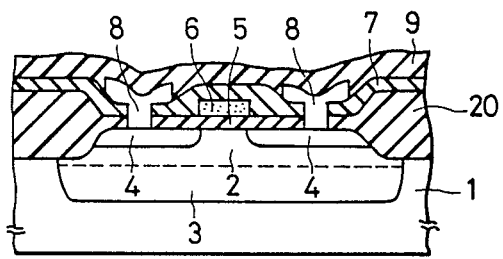

(1) A p$^-$-type silicon substrate is prepared having a resistivity of 10 ohms per unit area (FIG. 6(1)).

(2) Ions are implanted via an SiO$_2$ film M$_1$ and a resist film M$_2$ to form a high-concentration layer 3. Boron ions (B) are used at an acceleration voltage of 50 KeV in a dosage of $5 \times 10^{12}$ to $2 \times 10^{13}$ cm$^{-2}$ (FIG. 6(2)).

(3) An epitaxial layer 1a is formed maintaining a thickness of 0.8 to 1.7 $\mu$m (FIG. 6(3)).

(4) Ions are implanted into the p-type well via an SiO$_2$ film M$_3$, and Si$_3$N$_4$ film M$_4$ and a resist film M$_5$. BF$_2$ ions are used at an acceleration voltage of 60 KeV in a dosage of $2 \times 10^{12}$ cm$^{-2}$ (FIG. 6(4)).

(5) Then, a field oxide film 20 is formed, a gate oxide film 5 is formed, and a gate electrode 6 is formed. The gate electrode 6 is formed in a size of 1.5 $\mu$m (FIG. 6(5)).

(6) A source and a drain 4 are formed by implanting arsenic (As) ions at an acceleration voltage of 80 KeV in a dosage of $3 \times 10^{16}$ cm$^{-2}$ (FIG. 6(6)).

(7) An interlayer insulating film 7, wiring electrodes 8, and a protection film 9 are formed (FIG. 6(7)).

Embodiment 2

Figure 7:
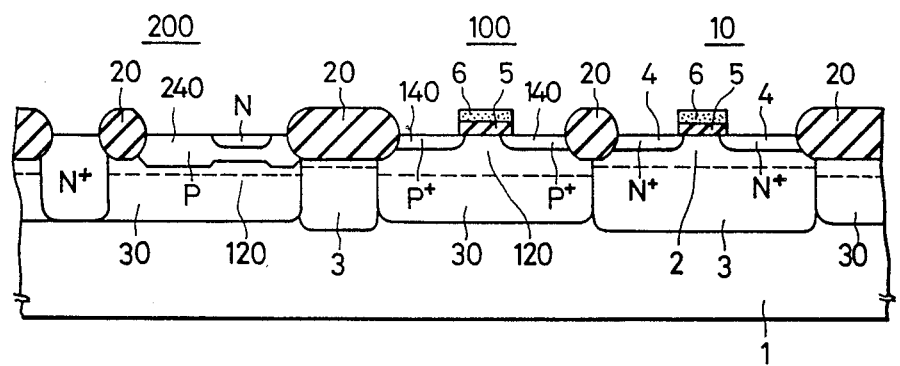
FIG. 7 is a section view of a semiconductor device which contains a bipolar transistor and a CMOS transistor according to a second embodiment of the present invention.

FIG. 7 illustrates a Bi-CMOS semiconductor device which has a bipolar transistor and a CMOSFET in the same substrate according to another embodiment of the present invention.

A p-channel MOSFET 100 is comprised of an n-type well region 120 having an n$^+$-type high-concentration layer 30, p$^+$-type source and drain 140, a gate oxide film 5, and a gate electrode 160. An npn bipolar transistor 200 has a p-type base layer 240 and an n-type collector layer. The n-type collector layer corresponds to the n-type well region 120 which has the n$^+$-type high-concentration layer 30 in the p-channel MOSFET.

According to this embodiment, the n-type well region 120 has a thickness of as small as about 1 to 2 $\mu$m. Therefore, a bipolar transistor can be formed having a very wide current gain band width.

Figure 8:
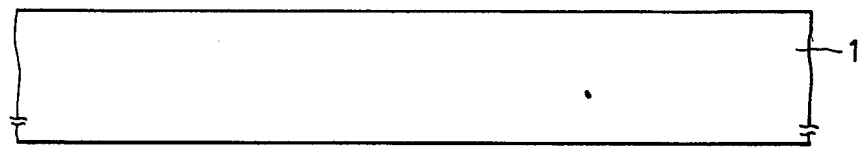
FIGS. 8(1)–8(7) are diagrams explaining a process for producing the semiconductor device of FIG. 7.
Figure 8:
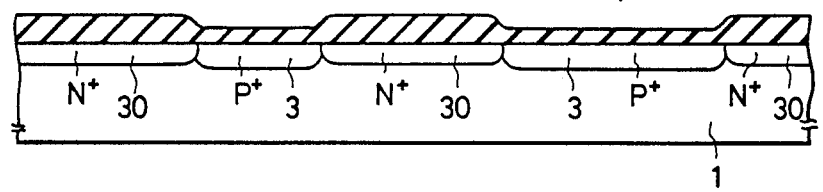
Figure 8:
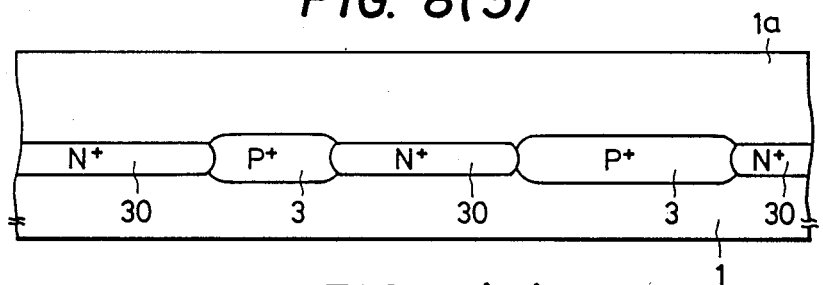
Figure 8:
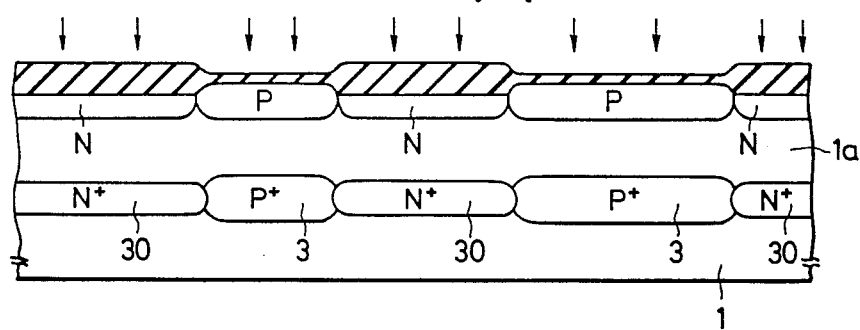
Figure 8:
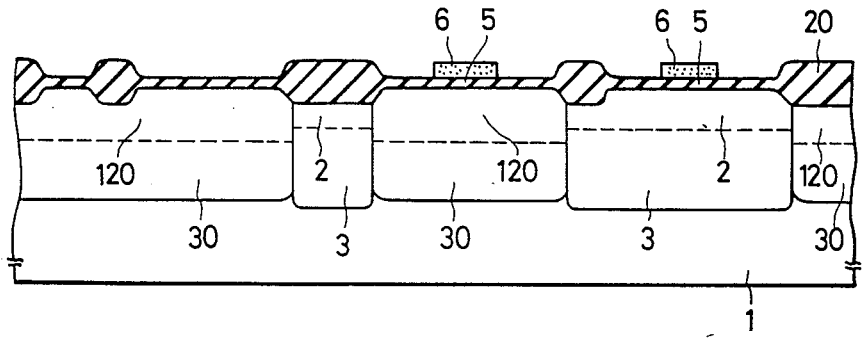
Figure 8:
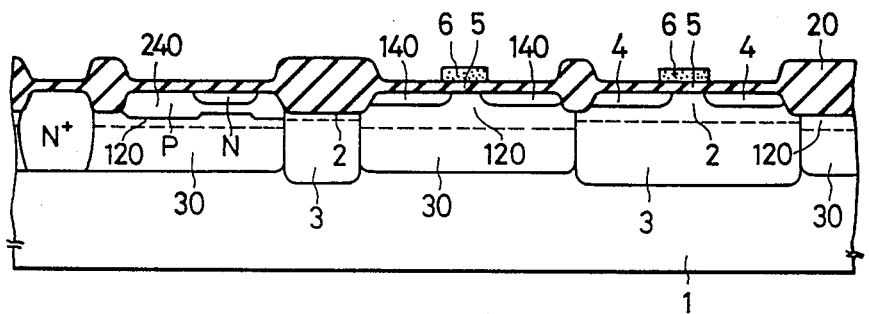
Figure 8:
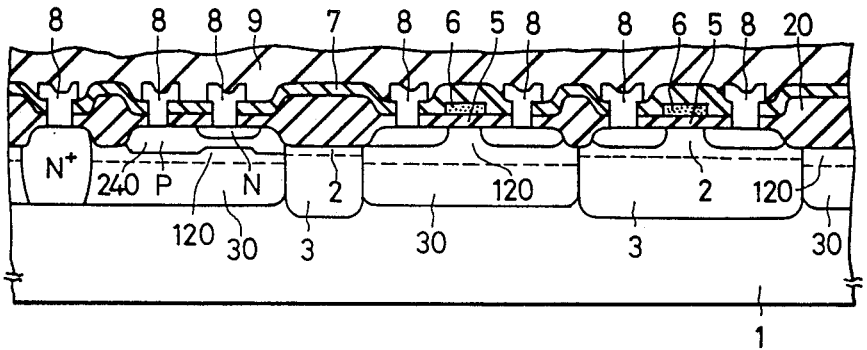

FIG. 8 illustrates a manufacturing process according to this embodiment.

(1) A p$^-$-type silicon substrate is prepared having a resistivity of 10 ohms per unit area (FIG. 8(1)).

(2) A high-concentration layer 30 is formed in the n-type well (by the diffusion of antimony), and a high-concentration layer 3 is formed in the p-type well by the implantation of boron ions at an acceleration voltage of 50 KeV in a dosage of $5 \times 10^{12}$ to $2 \times 10^{13}$ cm$^{-2}$ (FIG. 8(2)).

(3) An epitaxial layer 1a is formed maintaining a thickness of 0.8 to 1.7 $\mu$m (FIG. 8(3)).

(4) Phosphorus ions are implanted into the n-type well at an acceleration voltage of 100 KeV in a dosage of $1 \times 10^{12}$ cm$^{-2}$, and BF$_2^+$ ions are implanted into the p-type well at an acceleration voltage of 50 KeV in a dosage of $2 \times 10^{12}$ cm$^{-2}$ (FIG. 8(4)).

(5) A field oxide film 20 is formed, a gate oxide film 5 is formed, and a gate electrode 6 is formed (maintaining a size of 1.5 $\mu$m) (FIG. 8(5)).

(6) A base layer 240 is formed, and source and drain 4, 140 of n-channel MOSFET and p-channel MOSFET are formed (FIG. 8(6)).

(7) An interlayer insulating film 7, wiring electrodes 8 and a protection film 9 are formed (FIG. 8(7)).

Figure 1A:
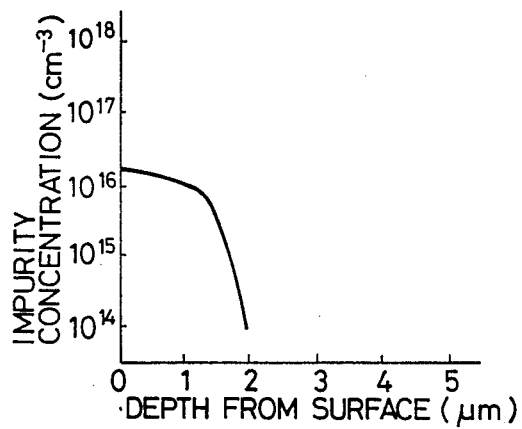
FIG. 1(a) is a diagram showing concentration profiles of a conventional well structure.
Figure 1B:
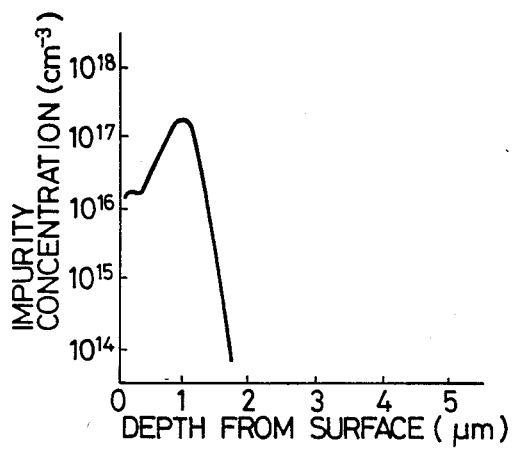
FIG. 1(b) is a diagram showing a concentration profile of a retrograde well.
Figure 1C:
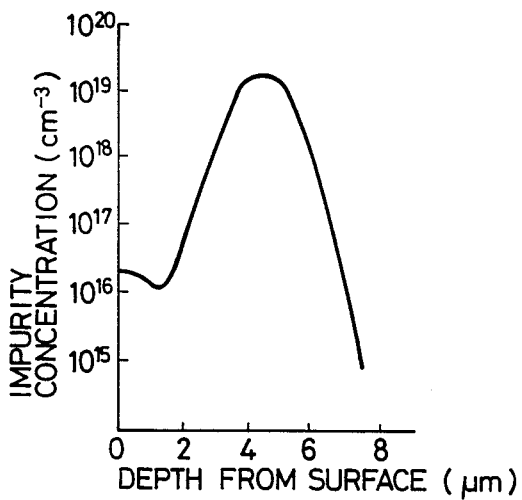
FIG. 1(c) is a diagram showing a concentration profiles of another retrograde well.
Figure 2:
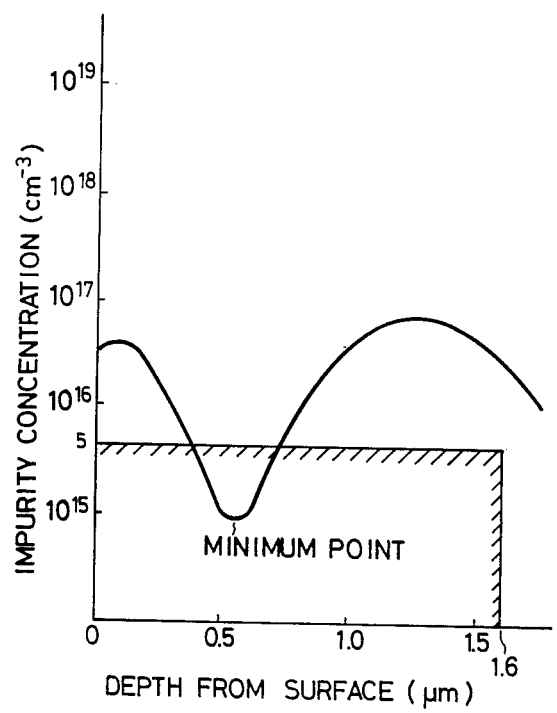
FIG. 2 is a diagram showing the principle of the present invention, i.e., showing a relationship between the depth from the surface and the carrier concentration, as well as a desired region according to the present invention.
Figure 3:
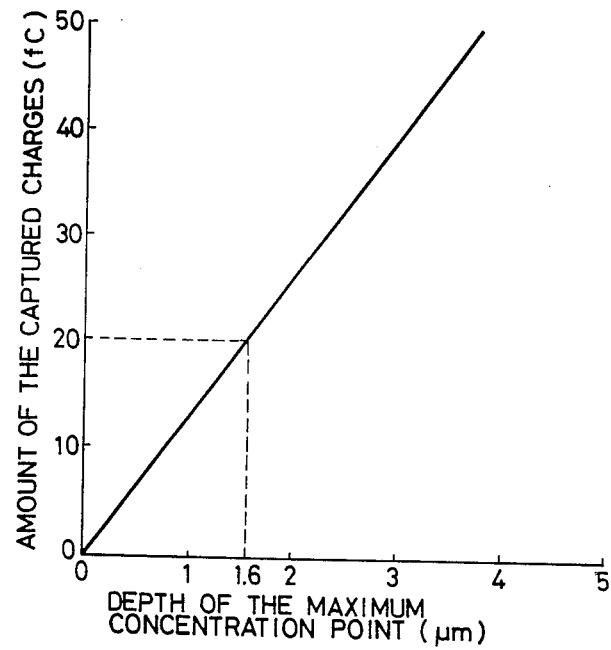
FIG. 3 is a diagram showing a relationship between the position of a maximum concentration point and the amount of the captured charge.
Figure 4:
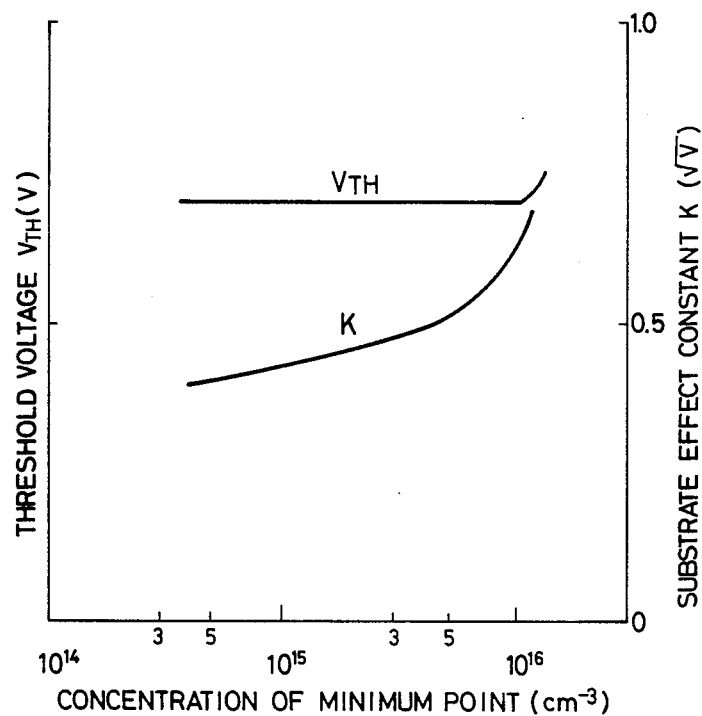
FIG. 4 is a diagram showing the change in the threshold voltage ($V_{TH}$) and in the substrate effect constant (K) with the change in the concentration of the minimum point.
Figure 9:
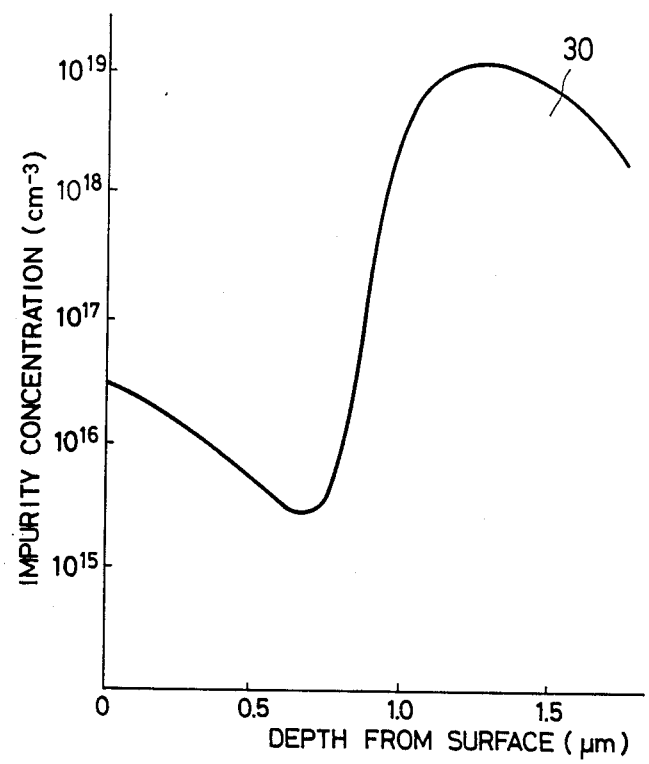
FIG. 9 is a diagram showing a concentration profile in the direction of depth in the well in semiconductor device of FIG. 7.

FIG. 9 shows a representative example of the concentration profile in the direction of depth of the substrate under the gate in the n-type well region formed according to the above-mentioned embodiment. Since the high-concentration layer 30 is formed by the diffusion of antimony, a maximum concentration becomes greater than $10^{19}$ cm$^{-3}$, and the well resistance can be greatly reduced. Further, even with the n-type well, the minimum point satisfies the conditions shown in FIG. 2.

In the above embodiment, the high-concentration layers 3 and 30 are formed through the epitaxial steps. They, however, can be formed even by the high-energy ion implantation method.

What is claimed is:

1. In a semiconductor device in which at least one well region is formed in a surface region of a semiconductor substrate, extending to the surface of the substrate, a semiconductor element is formed in the at least one well region, and the impurity concentration profile in the at least one well region has a shape, in the direction of increasing depth from the surface of the well region, of a valley, the improvement wherein said device includes a plurality of well regions in the semiconductor substrate, at least one of said plurality of well regions being of opposite conductivity type to that of the remainder of the plurality of well regions, with said plurality of well regions having said impurity concentration profile, and with a plurality of semiconductor elements being formed respectively in the well region of opposite conductivity type and in the remainder of the plurality of well regions; wherein said plurality of semiconductor elements include at least one bipolar transistor and at least two MOSFETs, the MOSFETs being formed respectively in the at least one well region of opposite conductivity type and in at least one of the remainder of the plurality of well regions, whereby a CMOS structure is formed; wherein the concentration at a minimum point of said profile is greater than $5 \times 10^{14}$ cm$^{-3}$ but is smaller than $5 \times 10^{15}$ cm$^{-3}$; and wherein the position of the minimum point is within 1.6 µm from the surface of the semiconductor substrate.

2. A semiconductor device according to claim 1, wherein the concentration at said minimum point is greater than $1 \times 10^{15}$ cm$^{-3}$ but is smaller than $5 \times 10^{15}$ cm$^{-3}$.

3. A semiconductor substrate having at least one well region formed in a surface region of said substrate, the at least one well region extending to the surface of the substrate, the at least one well region being adapted to have semiconductor elements formed therein, the at least one well region having an impurity concentration profile, in the direction of increasing distance from the surface thereof, in the shape of a valley, the concentration at a minimum point of said profile being greater than $5 \times 10^{14}$ cm$^{-3}$ but smaller than $5 \times 1^{-15}$ cm$^{-3}$, and the position of said minimum point being within 1.6 µm from the surface of the semiconductor substrate.

* * * * *